United States Patent
Kim et al.

(10) Patent No.: US 11,955,318 B2
(45) Date of Patent: Apr. 9, 2024

(54) ASH RATE RECOVERY METHOD IN PLASMA STRIP CHAMBER

(71) Applicant: Applied Materials, Inc., Santa Clara, CA (US)

(72) Inventors: Yongkwan Kim, Fremont, CA (US); Changhun Lee, San Jose, CA (US); Kyeong-Tae Lee, Livermore, CA (US); Chung Hoan Kim, San Jose, CA (US); Youngmin Shin, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 546 days.

(21) Appl. No.: 17/199,729

(22) Filed: Mar. 12, 2021

(65) Prior Publication Data

US 2022/0293395 A1  Sep. 15, 2022

(51) Int. Cl.
  *C23C 16/40* (2006.01)
  *G03F 7/42* (2006.01)
  *H01J 37/32* (2006.01)

(52) U.S. Cl.
  CPC ...... *H01J 37/32357* (2013.01); *C23C 16/402* (2013.01); *G03F 7/427* (2013.01); *H01J 37/32724* (2013.01); *H01J 37/32733* (2013.01); *H01J 37/32899* (2013.01); *H01J 2237/338* (2013.01)

(58) Field of Classification Search
  None
  See application file for complete search history.

(56) References Cited

U.S. PATENT DOCUMENTS

| | | | |
|---|---|---|---|
| 5,382,316 A | * | 1/1995 | Hills ............... H01L 21/31138 216/48 |
| 5,908,672 A | | 6/1999 | Ryu et al. |
| 8,999,847 B2 | | 4/2015 | Furuta et al. |
| 10,217,627 B2 | | 2/2019 | Lu et al. |

(Continued)

FOREIGN PATENT DOCUMENTS

| | | |
|---|---|---|
| CN | 104498899 A | 4/2015 |
| JP | 2007149968 A | 6/2007 |

(Continued)

OTHER PUBLICATIONS

International Search Report/Written Opinion issued to PCT/US2022/015782 dated Jun. 7, 2022.

(Continued)

*Primary Examiner* — David P Turocy
(74) *Attorney, Agent, or Firm* — Patterson + Sheridan, LLP

(57) ABSTRACT

A method for recovering ashing rate in a plasma processing chamber includes positioning a substrate in a processing volume of a processing chamber, wherein the substrate has a silicon chloride residue formed thereon. The method further includes evaporating the silicon chloride residue from the substrate. The method further includes depositing the evaporated silicon chloride on one or more interior surfaces in the processing volume. The method further includes exposing the deposited silicon chloride to an oxidizing environment to convert the deposited silicon chloride to a silicon oxide passivation layer. The oxidizing environment can comprise an oxygen-containing plasma, oxygen radicals, or a combination thereof.

20 Claims, 6 Drawing Sheets

(56) References Cited

U.S. PATENT DOCUMENTS

| | | |
|---|---|---|
| 2001/0012699 A1 | 8/2001 | Maeda |
| 2004/0137749 A1 | 7/2004 | Ying et al. |
| 2004/0203251 A1* | 10/2004 | Kawaguchi ....... H01L 21/02071 |
| | | 257/E21.252 |
| 2006/0019492 A1 | 1/2006 | Lee |
| 2006/0289384 A1 | 12/2006 | Pavel et al. |
| 2007/0051471 A1* | 3/2007 | Kawaguchi ....... H01J 37/32357 |
| | | 156/345.36 |
| 2007/0254489 A1 | 11/2007 | Kawaguchi et al. |
| 2007/0272359 A1 | 11/2007 | Kawaguchi et al. |
| 2009/0215251 A1 | 8/2009 | Vellaikal et al. |
| 2011/0300720 A1 | 12/2011 | Fu et al. |
| 2012/0222752 A1 | 9/2012 | Diaz et al. |
| 2012/0285492 A1 | 11/2012 | Lee et al. |
| 2016/0099131 A1 | 4/2016 | Kihara et al. |
| 2017/0323768 A1 | 11/2017 | Zhang et al. |
| 2019/0382889 A1 | 12/2019 | Parimi et al. |

FOREIGN PATENT DOCUMENTS

| | | |
|---|---|---|
| TW | 201635334 A | 10/2016 |
| WO | 2015/199111 A1 | 12/2015 |

OTHER PUBLICATIONS

Tawain Office Action dated Sep. 7, 2023 for Application No. 111108929.

* cited by examiner

ASH RATE RECOVERY METHOD IN PLASMA STRIP CHAMBER

BACKGROUND

Field

The present disclosure generally relates to a method for implementation in a semiconductor processing system, and more particularly, to a method for increasing the service interval of a plasma processing chamber.

Description of the Related Art

Formation of integrated circuits involves sequentially forming or depositing multiple electrically conductive and insulative layers in or on a substrate. Etching processes can be used to form geometric patterns in the layers or vias for electrical contact between the layers. General etching processes include wet etching, in which one or more chemical reagents are brought into direct contact with the substrate, and dry etching, such as plasma etching.

Various types of plasma etching processes include plasma etching, reactive ion etching, and reactive ion beam etching. In many of these plasma etching processes, a gas is first introduced into a reaction chamber through a gas distribution plate (GDP) and then plasma is generated from the gas. The ions, free radicals, and electrons in the plasma react chemically with the layer material on the substrate to form residual products, which leave the surface of the substrate and thus, etch the material from the substrate. The gas distributed by the gas distribution plate not only provides the source for the free radicals and ions, but can also be used to influence the lateral etch rate.

Before the etching process is performed, the substrate is typically coated with a layer of resist (for example, a photoresist), the resist is patterned, and the pattern is transferred to underlying layers by etching—with the patterned resist layer serving as an etch mask. Many such etching processes leave resist and post-etch residues on the substrate that must be removed or stripped before the next processing step. One technique which has been used for photoresist stripping is the technique of plasma ashing.

During plasma ashing a plasma can be formed either remotely or in-situ. In a remote or downstream plasma ashing process, plasma is formed remotely, and radicals in gas phase are delivered into the processing region of a plasma chamber via a gas distribution plate. In an in-situ plasma ashing process, processing gas enters the processing region via a gas distribution plate and then plasma is generated in the processing region. The gas distribution plate in the plasma chamber can become gradually contaminated. For instance, volatile reaction products and byproducts (e.g., refractory metals) coated on the gas distribution plate can result in obstruction of the gas flow openings of the gas distribution plate. This causes process drift and poor substrate to substrate repeatability. Additionally, volatile substances and byproducts coating the gas distribution plate may promote oxygen recombination during the ashing process. As the level of contamination of the gas distribution plate increases, the ash rate correspondingly suffers degradation. This degradation can be up to 90% and is often the limiting factor for the number of substrates which can be processed between cleaning of the gas distribution plate. Thus, as the time between cleans diminishes, productivity suffers and the cost of ownership increases.

Cleaning the gas distribution plate typically involves ramping down the chamber and removing the gas distribution plate for cleaning. However, this method is often very time consuming since it involves breaking vacuum, replacing the gas distribution plate, and ramping process conditions up to continue processing. One method for extending the time between cleaning is to provide cleaning gas through the gas distribution plate during a specific cleaning operation after one or more substrates have been processed. However, performing cleaning operations consumes time in which substrates cannot be processed and costly aggressive gases also attack and degrade chamber components. Thus, the use of cleaning gas limits productivity and process throughput.

Therefore, a need exists for reducing the contamination of chamber parts, for example, gas distribution plates.

SUMMARY

The present disclosure generally relates to a method for implementation in a semiconductor processing system, and more particularly, to a method for increasing the service interval of a plasma processing chamber.

In one aspect, a method is provided. The method includes positioning a substrate in a processing volume of a processing chamber, wherein the substrate has a silicon chloride residue formed thereon. The method further includes evaporating the silicon chloride residue from the substrate. The method further includes depositing the evaporated silicon chloride on one or more interior surfaces in the processing volume. The method further includes exposing the deposited silicon chloride to an oxidizing environment to convert the deposited silicon chloride to a silicon oxide passivation layer.

Implementations can include one or more of the following. Evaporating the silicon chloride residue from the substrate includes heating the substrate to a temperature of at least 200 degrees Celsius. The oxidizing environment includes an oxidizing plasma, oxidizing reactants, or a combination thereof. The oxidizing environment includes an oxygen-containing plasma, oxygen radicals, or a combination thereof. The oxygen radicals are formed by energizing a gas mixture including an oxygen-containing gas in a remote plasma chamber. The oxygen-containing gas includes an oxidizing agent selected from oxygen, water vapor, ozone, nitrous oxide, or a combination thereof. The gas mixture further includes an additive selected from nitrogen, argon, helium, or a combination thereof. Evaporating the silicon chloride residue from the substrate includes heating the substrate in a gas mixture of oxygen and nitrogen. Exposing the deposited silicon chloride to the oxidizing environment further includes maintaining the substrate at the temperature of at least 200 degrees Celsius. A flow ratio of oxygen to nitrogen is about 10:1. At least a portion of the one or more chamber surfaces has a refractory metal deposited thereon and the silicon oxide passivation layer is formed over the refractory metal. The refractory metal is selected from tungsten and titanium. At least one of the one or more chamber surfaces are formed from aluminum, stainless steel, or a combination thereof. The one or more chamber surfaces include a surface of a gas distribution plate.

In another aspect, a method is provided. The method includes exposing a substrate having an exposed silicon-containing surface to an etching gas mixture including a chlorine-containing gas to form a silicon chloride residue on the exposed silicon-containing surface. The method further includes positioning the substrate in a processing volume of a plasma processing chamber. The method further includes heating the substrate to evaporate the silicon chloride residue from the exposed silicon-containing surface and deposit the silicon chloride residue on one or more interior chamber surfaces within the processing volume. The method further includes exposing the silicon chloride to an oxidizing environment to convert the silicon chloride residue to form a silicon oxide passivation layer over the one or more interior surfaces in the processing volume of the plasma processing chamber.

Implementations can include one or more of the following. Evaporating the silicon chloride residue from the substrate includes heating the substrate to a temperature of at least 200 degrees Celsius. The oxidizing environment includes an oxidizing plasma, oxidizing reactants, or a combination thereof. The oxidizing environment includes an oxygen-containing plasma, oxygen radicals, or a combination thereof. The oxygen radicals are formed by energizing a gas mixture including an oxygen-containing gas in a remote plasma chamber. The oxygen-containing gas includes an oxidizing agent selected from oxygen, water vapor, ozone, nitrous oxide, or a combination thereof. The gas mixture further includes an additive selected from nitrogen, argon, helium, or a combination thereof. Evaporating the silicon chloride residue from the substrate includes heating the substrate in a gas mixture of oxygen and nitrogen. Exposing the deposited silicon chloride to the oxidizing environment further includes maintaining the substrate at the temperature of at least 200 degrees Celsius. A flow ratio of oxygen to nitrogen is about 10:1. At least a portion of the one or more chamber surfaces has a refractory metal deposited thereon and the silicon oxide passivation layer is formed over the refractory metal. The refractory metal is selected from tungsten and titanium. At least one of the one or more chamber surfaces are formed from aluminum, stainless steel, or a combination thereof. The one or more chamber surfaces include a surface of a gas distribution plate.

In yet another aspect, a method is provided. The method includes positioning a substrate having an exposed silicon-containing surface in a first processing volume of a plasma processing chamber. The method further includes exposing the substrate to an etching gas mixture including a chlorine-containing gas to form silicon chloride residue on the exposed silicon-containing surface. The method further includes transferring the substrate to a second processing volume of a remote plasma processing chamber. The method further includes heating the substrate to evaporate the silicon chloride residue from the exposed silicon-containing surface onto a gas distribution plate positioned in the second processing volume. The method further includes exposing the silicon chloride residue on the gas distribution plate to an oxidizing environment to convert the silicon chloride residue to form a silicon oxide passivation layer over the gas distribution plate.

Implementations can include one or more of the following. Evaporating the silicon chloride residue from the substrate includes heating the substrate to a temperature of at least 200 degrees Celsius. The oxidizing environment includes an oxidizing plasma, oxidizing reactants, or a combination thereof. The oxidizing environment includes an oxygen-containing plasma, oxygen radicals, or a combination thereof. The oxygen radicals are formed by energizing a gas mixture including an oxygen-containing gas in a remote plasma chamber. The oxygen-containing gas includes an oxidizing agent selected from oxygen, water vapor, ozone, nitrous oxide, or a combination thereof. The gas mixture further includes an additive selected from nitrogen, argon, helium, or a combination thereof. Evaporating the silicon chloride residue from the substrate includes heating the substrate in a gas mixture of oxygen and nitrogen. Exposing the deposited silicon chloride to the oxidizing plasma further includes maintaining the substrate at the temperature of at least 200 degrees Celsius. A flow ratio of oxygen to nitrogen is about 10:1. At least a portion of the one or more chamber surfaces has a refractory metal deposited thereon and the silicon oxide passivation layer is formed over the refractory metal. The refractory metal is selected from tungsten and titanium. At least one of the one or more chamber surfaces are formed from aluminum, stainless steel, or a combination thereof. The one or more chamber surfaces include a surface of a gas distribution plate.

In another aspect, a non-transitory computer readable medium has stored thereon instructions, which, when executed by a processor, causes the process to perform operations of the above apparatus and/or method.

BRIEF DESCRIPTION OF THE DRAWINGS

So that the manner in which the above-recited features of the present disclosure can be understood in detail, a more particular description of the implementations, briefly summarized above, may be had by reference to implementations, some of which are illustrated in the appended drawings. It is to be noted, however, that the appended drawings illustrate only typical implementations of this disclosure and are therefore not to be considered limiting of its scope, for the disclosure may admit to other equally effective implementations.

Figure 1:
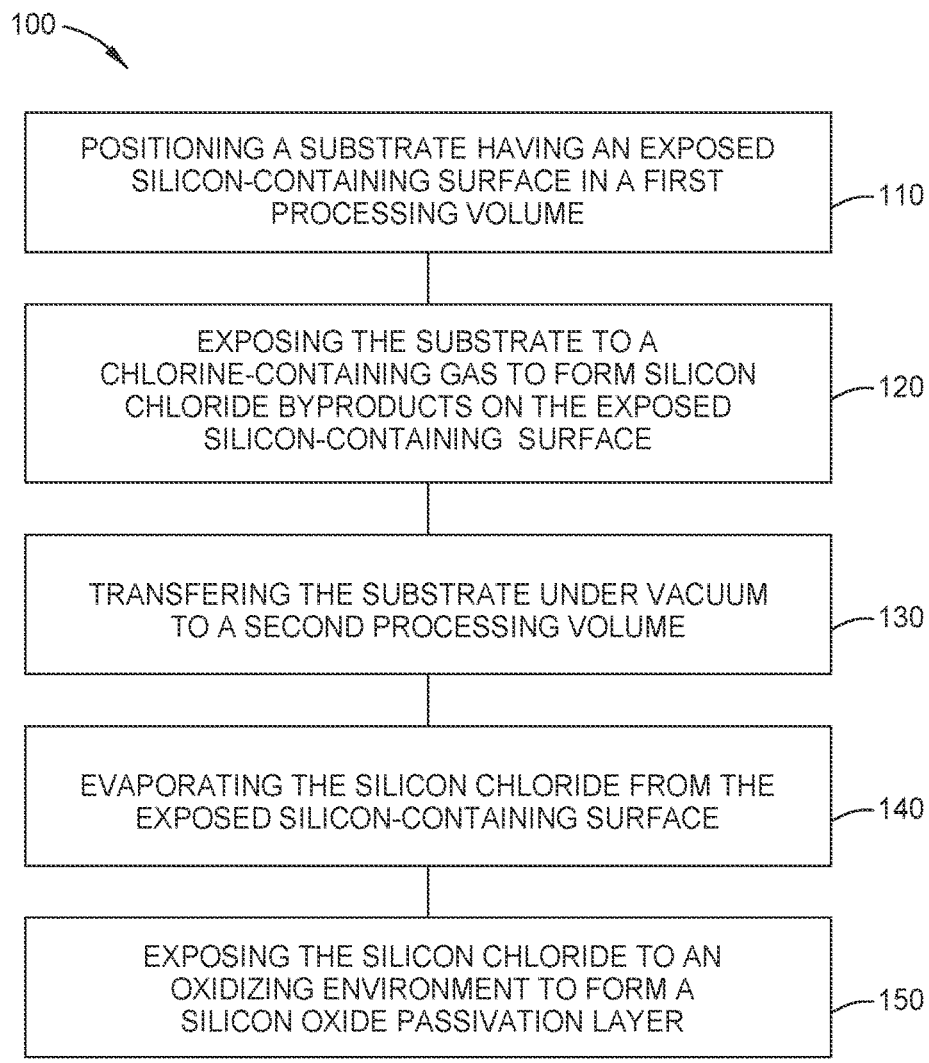
FIG. 1 depicts a flowchart of a method of improving ash rate in a plasma processing chamber according to one or more implementations of the present disclosure.

To facilitate understanding, identical reference numerals have been used, where possible, to designate identical elements that are common to the figures. It is contemplated that elements and features of one implementation may be beneficially incorporated in other implementations without further recitation.

DETAILED DESCRIPTION

The following disclosure describes methods for recovering ash rate in a plasma processing chamber. Certain details are set forth in the following description and in FIGS. 1-5B to provide a thorough understanding of various implementations of the disclosure. Other details describing well-known structures and systems often associated with plasma ashing processes and plasma etching processes are not set forth in the following disclosure to avoid unnecessarily obscuring the description of the various implementations.

Many of the details, dimensions, angles and other features shown in the Figures are merely illustrative of particular implementations. Accordingly, other implementations can have other details, components, dimensions, angles and features without departing from the spirit or scope of the present disclosure. In addition, further implementations of the disclosure can be practiced without several of the details described below.

While the particular apparatus in which the implementations described herein can be practiced is not limited, it is particularly beneficial to practice the implementations in a CENTRIS® ETCH system, a PRODUCER® ETCH system, or a CENTURA® AP system sold by Applied Materials, Inc., Santa Clara, Calif. Additionally, other available etch systems can also benefit from implementations described herein. The above listing of semiconductor equipment is illustrative only, and other etch reactors, and non-etch equipment (such as CVD reactors, or other semiconductor processing equipment) may also be suitably modified in accordance with the present teachings.

In some metal etch applications, a metal stack with photoresist and/or carbon mask formed thereon is etched in an capacitively coupled or inductively coupled plasma chamber. The wafer is then moved to a downstream plasma chamber, where the photoresist and/or carbon mask is ashed by oxygen radicals. However, due to residual metal byproducts present on the wafer the gas distribution plate of the downstream plasma chamber often becomes contaminated with the residual metal byproduct.

Currently, maintaining ash performance in the downstream plasma chamber is limited to waferless cleaning and physically opening the chamber to swap out contaminated chamber parts. However, waferless cleaning with $O_2/N_2/Ar$ gas is typically unable to remove accumulated metal byproducts and swapping out chamber parts requires chamber downtime and lost production, for example, in some cases for twelve or more hours.

In some implementations of the present disclosure, a bare silicon wafer is first etched using chlorine-containing gas based process. The chlorine-containing gas based process results in formation of a silicon chloride (e.g., $SiCl_x$ where x=1 to 4) byproduct fume on the silicon wafer. The silicon wafer is then moved to a downstream plasma chamber, where a high pedestal temperature evaporates the $SiCl_x$ byproduct fume from the surface of the wafer and deposits the $SiCl_x$ byproduct on the metal-contaminated surface of a chamber part, for example, the surface of a gas distribution plate. An oxidizing environment in the downstream plasma chamber converts the silicon chloride byproduct to a silicon oxide (e.g., $SiO_x$ where x=1 to 2) layer, which is formed over the metal-contaminated surface. After the ash recovery process, oxygen recombination rates become more similar to the oxygen recombination rates for a clean gas distribution plate, and the ash rate is recovered as a result. In some examples, compared to a clean gas distribution plate, 90% of the original ash rate can be recovered by cycling 500× bare silicon wafers through the ash recovery process described herein. Advantageously, the ash recovery process of the present disclosure recovers ash rate by in-situ silicon oxide layer formation over a contaminated chamber surface using a carrier wafer containing a silicon chloride byproduct formed thereon, which eliminates the need to open the chamber to swap out contaminated chamber parts.

FIG. 1 depicts a flowchart of a method 100 of improving ash rate in a plasma processing chamber according to one or more implementations of the present disclosure. FIGS. 2A-2E depict a sequence of schematic cross-sectional views of the method 100 according to one or more implementations of the present disclosure. Although method 100 and FIGS. 2A-2E are discussed in the context of forming a silicon oxide passivation layer over contaminants, for example, metal contaminants, formed on a gas distribution plate in a plasma processing chamber, it should be understood that method 100 can be used to form silicon oxide passivation layers over other types of chamber parts and in other types of processing chambers.

Figure 2A:
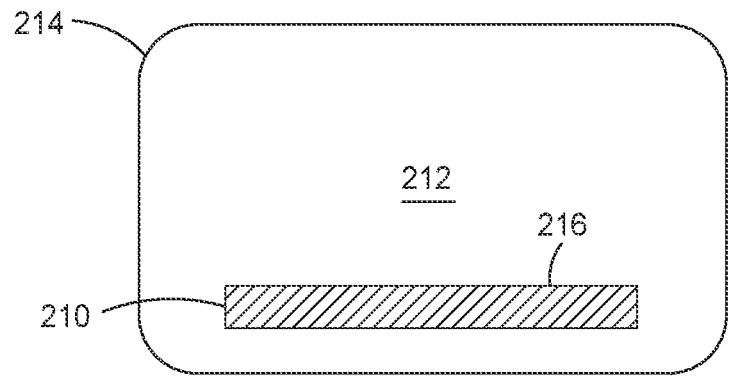
FIGS. 2A-2E depict a sequence of schematic cross-sectional views of an ash rate recovery process according to one or more implementations of the present disclosure.

The method 100 begins at operation 110 by positioning a substrate 210 in a first processing volume 212 defined by a first plasma processing chamber 214 as shown in FIG. 2A. The substrate 210 has an exposed silicon-containing surface 216. The substrate 210 can be a semiconductor wafer. The substrate 210 can be a silicon wafer, e.g., a 200-mm wafer, a 300-mm wafer, or a 450-mm wafer. The silicon-containing surface 216 can include materials such as bare silicon, silicon, strained silicon, amorphous silicon, doped silicon, doped amorphous silicon, poly silicon, or doped poly silicon. The first plasma processing chamber 214 can form at least one of an inductively coupled plasma, a capacitively coupled plasma, and a remote plasma. In one example, the first plasma processing chamber 214 is a SYM3® etching chamber, available from Applied Materials, Inc., located in Santa Clara, Calif. It is contemplated that other processing chambers, including those from other manufactures, may be adapted to practice implementations of the present disclosure.

Figure 2B:
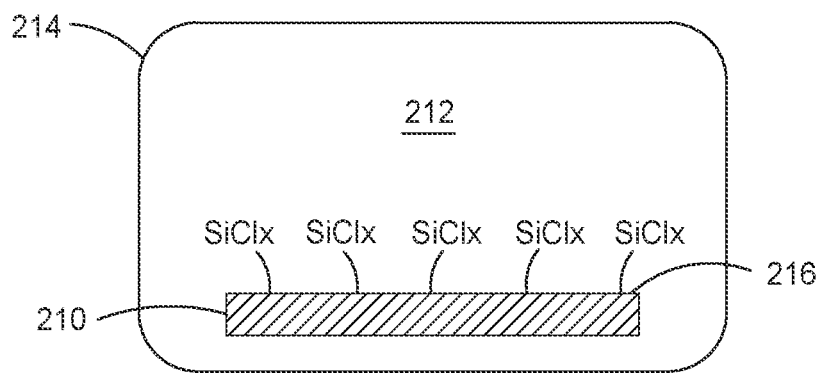

The method 100 continues at operation 120, where the substrate 210 is exposed to a chlorine-containing gas to form silicon chloride ($SiCl_x$) byproducts, for example, silicon chloride residue, on the exposed silicon-containing surface 216 as shown in FIG. 2B. The chlorine-containing gas can be chlorine gas ($Cl_2$), boron trichloride ($BCl_3$), combinations thereof, or the like. In one implementation, operation 120 provides chlorine at a rate of from about 20 to about 1,000 sccm, for example, from about 40 sccm to about 200 sccm, optionally nitrogen ($N_2$) at a rate of 0 to 200 sccm, and optionally $CF_4$ at a rate of from about 0 sccm to about 100 sccm. Further, operation 120 applies from about 300 to about 3,000 W, for example, from about 400 W to about 1,000 W, of plasma power and from about 0 to about 500 W, for example, from about 50 W to about 300 W of bias power and maintains a substrate temperature at from about 0 to about 200 degrees Celsius, from about 20 to about 100 degrees Celsius, and a pressure in the reaction chamber at from about 2 to about 300 mTorr, for example, from about 10 to about 100 mTorr. In one example, $Cl_2$ is provided at a rate of 100 sccm, $N_2$ at a rate of 100 sccm, $CF_4$ at a rate of 35 sccm, 700 W of plasma power, 100 W of bias power, a substrate temperature of 50 degrees Celsius, and a pressure of 40 mTorr.

Figure 2C:
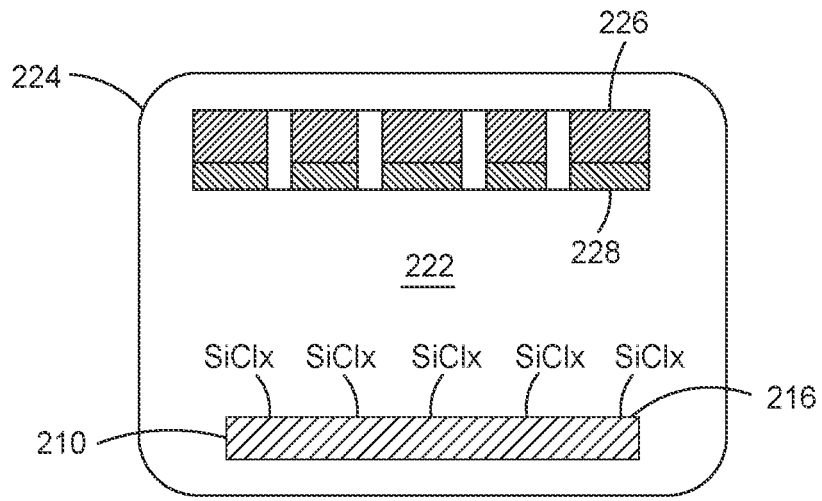
Figure 4:
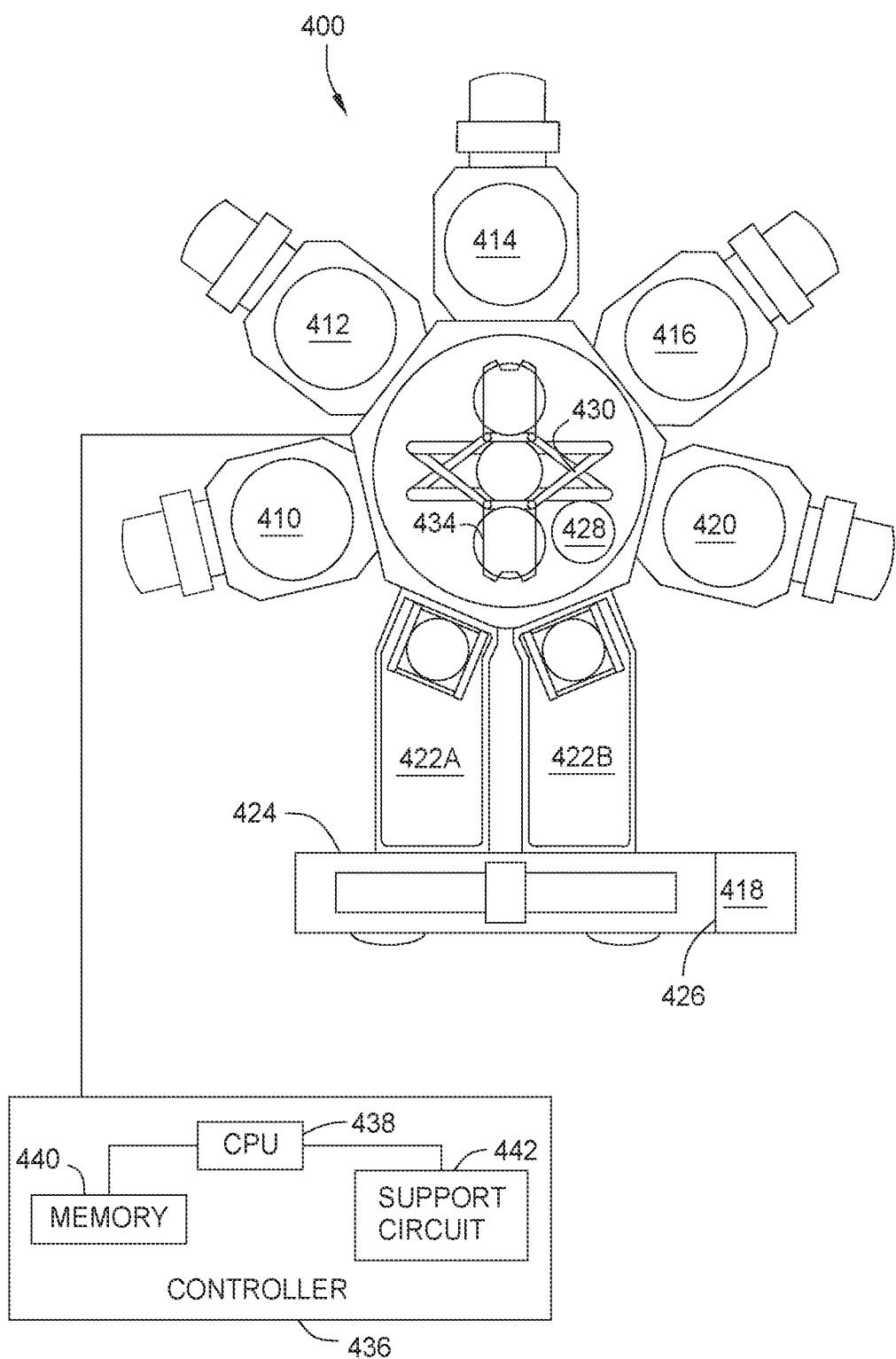
FIG. 4 depicts a schematic plan view of an integrated processing system that can be used to perform the methods described herein according to one or more implementations of the present disclosure.

The method 100 continues at operation 130, where the substrate 210 having the silicon chloride ($SiCl_x$) byproducts on the exposed silicon-containing surface 216 is transferred under vacuum to a second processing volume 222 defined by a second plasma processing chamber 224 as shown in FIG. 2C. In one example, the substrate 210 is transferred under vacuum using a robot of an integrated processing platform, for example, robot 430 of the integrated processing system 400 as shown in FIG. 4.

The second plasma processing chamber 224 can be configured to form at least one of an inductively coupled plasma, a capacitively coupled plasma, and a remote plasma. The second plasma processing chamber 224 includes one or more interior surfaces, for example, a gas distribution plate 226 positioned in the second processing volume 222. The one or more chamber surfaces can be formed from aluminum, stainless steel, quartz, or a combination thereof. At least a portion of the one or more chamber surfaces has a contaminant formed thereon. For example, the gas distribution plate 226 has a layer of contaminants 228 formed thereon. In one example, the contaminant is a refractory metal selected from tungsten and titanium.

In one example, the second plasma processing chamber 224 is a remote plasma chamber, such as, for example, an AXIOM® chamber. The remote plasma reactor can be a plasma reactor in which the radio-frequency plasma is confined such that only reactive neutrals are allowed to enter a processing volume of the processing chamber. Such confinement scheme precludes plasma-related damage of the substrate or circuits formed on the substrate. In the AXIOM® chamber, a backside of the substrate can be heated radiantly by quartz halogen lamps or resistively heated or cooled using heat transfer (e.g., coolant circulating through the wafer support), such that the temperature of the substrate can be maintained at 20 to 450 degrees Celsius. The salient features of the reactor are briefly described below in reference to FIG. 3.

Figure 2D:
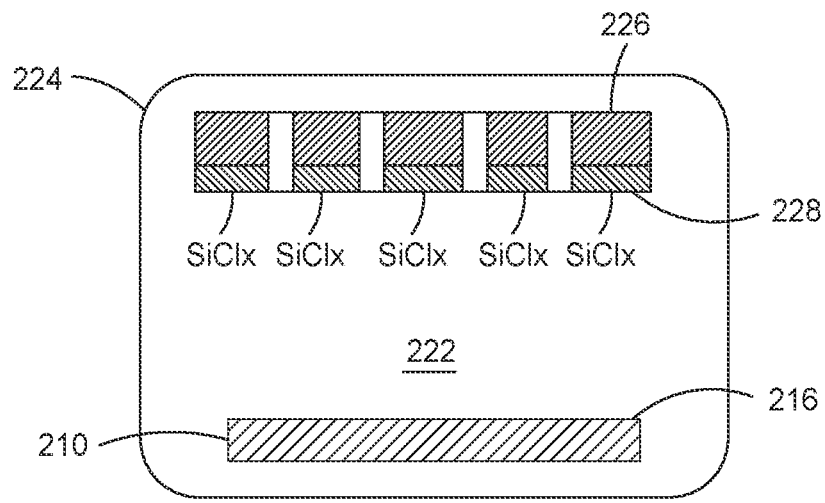

The method 100 continues at operation 140, where the silicon chloride (SiClx) byproducts are evaporated from the exposed silicon-containing surface 216 of the substrate 210 as shown in FIG. 2D. In some implementations, evaporating the silicon chloride byproducts from the substrate 210 includes heating the substrate 210 to a temperature of at least 200 degrees Celsius. In one example, the substrate 210 is heated to a temperature from about 200 degrees Celsius to about 300 degrees Celsius, for example about 250 degrees Celsius. The evaporated silicon chloride (SiClx) byproducts are deposited over the one or more chamber surfaces in the second processing volume 222. For example, as shown in FIG. 2D, the evaporated SiClx byproduct is formed over the layer of contaminants 228. In some implementations, operation 140 is performed in an oxygen-containing environment, for example, a gas mixture of oxygen and nitrogen.

In some implementations, the substrate 210 is heated, to about 250 degrees Celsius in a gas mixture of an oxygen-containing gas (e.g., oxygen, ozone, water vapor, nitrous oxide ($N_2O$), nitride oxide (NO), nitrogen dioxide ($NO_2$), and the like) and optionally an additive such as, for example, nitrogen, argon, helium, and the like. In one example, the gas mixture includes oxygen and nitrogen. The oxygen and nitrogen can be provided at a flow ratio of from about 8:1 to about 12:1, for example, about 10:1. In one example, oxygen and nitrogen are provided to the chamber at flow rates of about 5,000 sccm and about 500 sccm, respectively (e.g., at $O_2:N_2$ flow ratio of about 10:1). The oxygen and nitrogen can be provided at a pressure greater than 1 Torr for a duration of about 10-20 seconds.

Figure 2E:
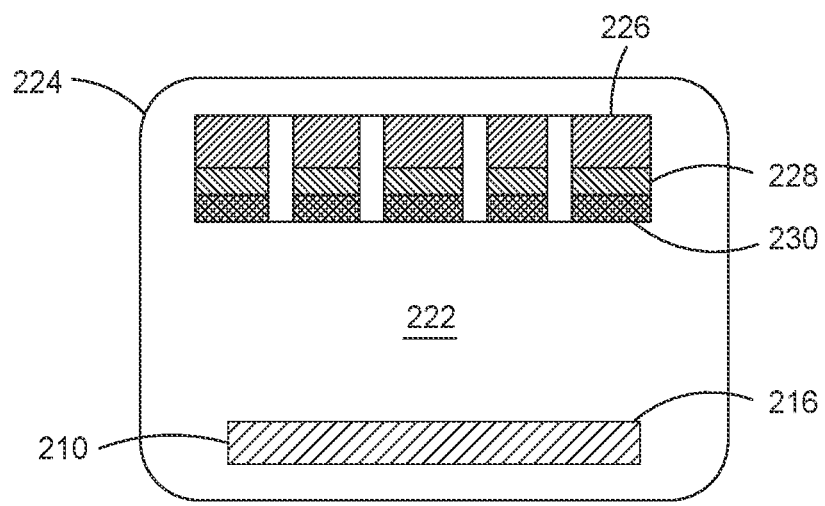

The method 100 continues at operation 150, where the deposited silicon chloride is exposed to an oxidizing environment to convert the deposited silicon chloride to a silicon oxide passivation layer as shown in FIG. 2E. The oxidizing environment can include, for example, an oxidizing plasma, oxidizing reactants, or a combination thereof. The oxidizing plasma can include an oxygen-containing plasma. The oxidizing plasma can be formed "in-situ" by exciting an oxygen-containing gas within the processing volume. The oxidizing reactants can include, for example, oxygen radicals and/or oxygen ions. The oxidizing reactants can be part of a remote plasma. The oxidizing reactants can be formed from a source gas by the plasma source of a remote plasma reactor.

In some implementations, at operation 150, the silicon chloride byproducts are exposed to oxidizing reactants that are formed from a source gas by the plasma source of a remote plasma reactor, for example, the remote plasma source 306 of the remote plasma processing system 300. The remotely generated oxidizing plasma can be formed by supplying oxygen gas through a mass flow controller to the remote plasma source 306, which excites the oxygen into a plasma. In some implementations, the remote plasma source 306 includes an ion filter that removes oxygen ions such as $O^+$ from the plasma as it diffuses towards the gas mixing volume 322 defined by the gas distribution plate 320. Thereby, principally neutral oxygen radicals O* are delivered as the excited oxidizing species into the processing volume 324 of the processing chamber 302. Alternative neutral oxygen radicals include excited atomic states of $O_2$*. The remote plasma source may not completely efficient so some neutral unexcited $O_2$ molecules can also reach the processing volume 324. In other implementations, the oxidizing plasma includes both oxygen radicals and oxygen ions.

In one example, operation 150 provides a source gas comprising oxygen and nitrogen at flow rates of from about 1,000 to about 9,000 sccm and from about 100 to about 900 sccm respectively, for example, an $O_2:N_2$ flow ratio of about 10:1. Further, operation 150 applies from about 3,000 to about 5,000 W at from about 200 to about 600 kHz to form the remote plasma, while maintaining a substrate temperature from at least about 150 to about 400 degrees Celsius and a gas pressure in the processing chamber at from about 0.5 to about 2 Torr. The duration of operation 150 can be generally about 15 to 60 seconds.

In another example, operation 150 provides about 3,500 sccm of $O_2$ and about 350 sccm of $N_2$ (i.e., an $O_2:N_2$ flow ratio of about 10:1), about 5,000 W of plasma power, a substrate temperature of about 250 degrees Celsius, a gas pressure of about 0.7 Torr, and for example, a duration of 20 seconds.

In some implementations, the deposited passivation layer 230 is silicon dioxide (or silicon oxide containing species). The oxidizing plasma can be sustained until the passivation layer 230 is deposited to a targeted thickness, for example, from about 2 Å to about 100 Å, for example, from about 10 Å to about 50 Å.

The method 100 can be performed periodically or at any desired interval such as every 25 to 250 substrates (or 1 to 10 RF hours) during batch ashing to improve run-to-run uniformity without significantly affecting overall throughput. It has also been discovered that the periodic performance of method 100 can also extend the throughput limit of the ashing process to at least about 2,000 to 6,000 substrates in a row before a standard full chamber cleaning process is needed.

Figure 3:
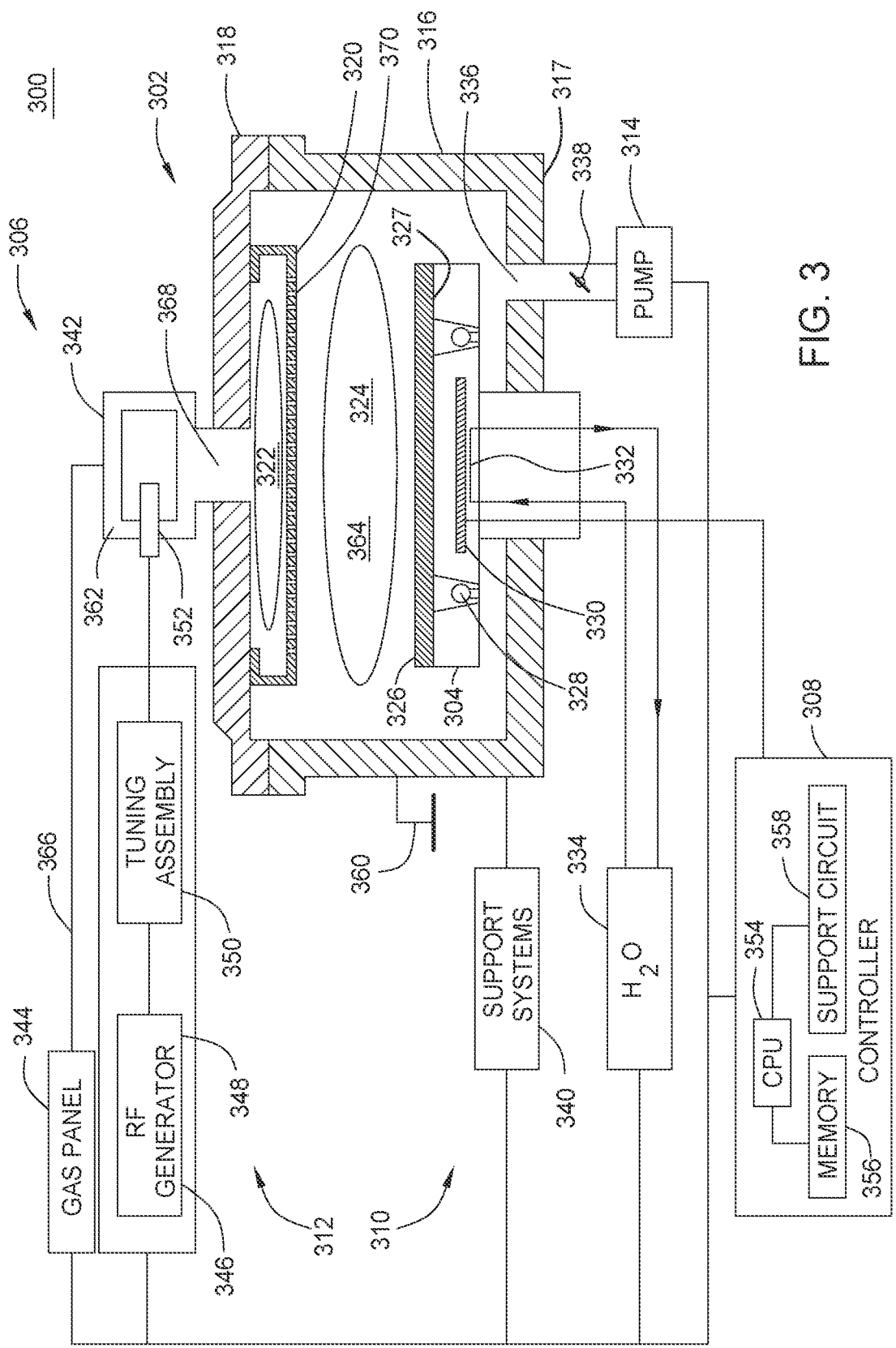
FIG. 3 depicts a schematic diagram of one example of a plasma processing chamber that can be used in performing the methods described herein according to one or more implementations of the present disclosure.

FIG. 3 depicts a schematic diagram of one example of a remote plasma processing system 300 that can be used in performing portions of the method 100. For example, operation 140 and operation 150 can be performed in the remote plasma processing system 300. The remote plasma processing system 300 can be an AXIOM® system available from Applied Materials, Inc. of Santa Clara Calif. The particular implementation of the remote plasma processing system 300 is provided to illustrate the present disclosure and should not be used to limit the scope of the present disclosure. The remote plasma processing system 300 includes a processing chamber 302, a remote plasma source 306, and a system controller 308.

The processing chamber 302 generally is a vacuum vessel, which includes a first portion 310 and a second portion 312. In one implementation, the first portion 310 includes a substrate pedestal 304, a sidewall 316 and a vacuum pump 314. The second portion 312 includes a lid 318 and a gas distribution plate (showerhead) 320, which defines a gas mixing volume 322 and a processing volume 324. The lid 318 and sidewall 316 are generally formed from a metal (e.g., aluminum (Al), stainless steel, or the like) and electrically coupled to a ground reference 360.

The substrate pedestal 304 supports a substrate (wafer) 326 within the processing volume 324. The substrate 326 can be substrate 210 having the silicon chloride residue formed thereon as described herein. In one implementation, the substrate pedestal 304 includes a source of radiant heat, such as gas-filled lamps 328, as well as an embedded resistive heater 330 and a conduit 332. The conduit 332 provides cooling water from a source 334 to the backside of the substrate pedestal 304. The substrate 326 sits on a surface 327 of the substrate pedestal 304. Gas conduction transfers heat from the substrate pedestal 304 to the substrate 326. The temperature of the substrate 326 can be controlled between about 20 and 400 degrees Celsius.

The vacuum pump 314 is coupled with an exhaust port 336 formed in the sidewall 316 or a bottom wall 317 of the processing chamber 302. The vacuum pump 314 is used to maintain a desired gas pressure in the processing chamber 302, as well as evacuate the post-processing gases and other volatile compounds from the processing chamber 302. In one implementation, the vacuum pump 314 includes a throttle valve 338 to control a gas pressure in the processing chamber 302.

The processing chamber 302 also includes conventional systems for retaining and releasing the substrate 326, detecting an end of a process, internal diagnostics, and the like. Such systems are collectively depicted in FIG. 3 as support systems 340.

The remote plasma source 306 includes a power source 346, a gas panel 344, and a remote plasma chamber 342. In one implementation, the power source 346 includes a radio-frequency (RF) generator 348, a tuning assembly 350, and an applicator 352. The RF generator 348 is capable of producing about 200 to 6,000 W at a frequency of about 200 to 600 kHz. The applicator 352 is inductively coupled to the remote plasma chamber 342 to inductively couple RF power to process gas (or gas mixture) 364 to form a plasma 362 in the chamber. In this implementation, the remote plasma chamber 342 has a toroidal geometry that confines the plasma and facilitates efficient generation of radical species, as well as lowers the electron temperature of the plasma. In other implementations, the remote plasma source 306 may be a microwave plasma source.

The gas panel 344 uses a conduit 366 to deliver the process gas 364 to the remote plasma chamber 342. The gas panel 344 (or conduit 366) can include mass flow controllers and shut-off valves, to control gas pressure and flow rate for each individual gas supplied to the remote plasma chamber 342. In the plasma 362, the process gas 364 is ionized and dissociated to form reactive species.

The reactive species are directed into the gas mixing volume 322 through an inlet port 368 in the lid 318. To minimize charge-up plasma damage to devices on the substrate 326, the ionic species of the process gas 364 are substantially neutralized within the gas mixing volume 322 before the gas reaches the processing volume 324 through a plurality of openings 370 in the gas distribution plate 320.

The system controller 308 includes a central processing unit (CPU) 354, a memory 356, and a support circuit 358. The CPU 354 may be of any form of a general-purpose computer processor used in an industrial setting. Software routines can be stored in the memory 356, such as random access memory, read only memory, floppy or hard disk, or other form of digital storage. The support circuit 358 is conventionally coupled to the CPU 354 and may include cache, clock circuits, input/output sub-systems, power supplies, and the like.

The software routines, when executed by the CPU 354, transform the CPU into a specific purpose computer (controller) 308 that controls the remote plasma processing system 300 such that the processes are performed in accordance with the present disclosure. The software routines may also be stored and/or executed by a second controller (not shown) that is located remotely from the remote plasma processing system 300.

In operation, positioning the substrate 326 is positioned on the substrate pedestal 304 in the processing volume 324 of the processing chamber 302. The substrate 326 has a silicon chloride (SiClx) residue formed thereon. The substrate 326 is heated using the resistive heater 330 to evaporate the silicon chloride residue from the substrate 326. The evaporated silicon chloride deposits on the gas distribution plate 320 in the processing volume 324. An oxidizing plasma is formed in the remote plasma source 306 and oxidizing reactants, for example, oxygen radicals and/or oxygen ions, formed in the remote plasma source 306 are delivered to the processing volume 324 via the gas distribution plate 320. The silicon chloride residue deposited on the gas distribution plate 320 is exposed to the oxidizing environment to convert the deposited silicon chloride residue to a silicon oxide passivation layer formed on the gas distribution plate 320.

FIG. 4 depicts a top plan view of an integrated processing system 400 that can be used in performing portions of the method 100. The integrated processing system 400 can be a CENTURA® integrated processing system available from Applied Materials, Inc. of Santa Clara Calif. The particular implementation of the integrated processing system 400 is provided to illustrate the present disclosure and should not be used to limit the scope of the present disclosure.

The integrated processing system 400 generally includes load-lock chambers 422A, 422B (collectively 422), processing chambers 410, 412, 414, 416, 420, and a robot 430. The load-lock chambers 422 protect vacuumed transfer chamber 428 of the integrated processing system 400 from atmospheric contaminants. The robot 430 uses a blade 434 to transfer the substrates between the load-lock chambers 422 and the processing chambers. At least one of the processing chambers is a plasma etching chamber described above in reference to operations 110 and 120. Further, one or more processing chambers may be the remote plasma chambers described above in reference to operations 130-150 and FIG. 3. Optionally, at least one of the processing chambers may be an annealing chamber or other thermal processing chamber. The integrated processing system 400 may also include other types of processing chambers and/or interfaces to processing systems. Further, the integrated processing system 400 may include one or more external metrology chambers 418 connected thereto using, e.g., a terminal 426 of a factory interface 424. The factory interface 424 is an atmospheric pressure interface that is used to transfer cassettes with the pre-processed and post-processed wafers between various processing systems and manufacturing regions within a semiconductor fabrication process.

The system controller 436 is coupled to and controls each module of the integrated processing system 400. Generally the system controller 436 controls all aspects of operation of the integrated processing system 400 using a direct control of modules and apparatus of the integrated processing system 400, or alternatively, by controlling the computers associated with these modules and apparatus. In operation, the system controller 436 enables feedback from the respective modules and apparatus to optimize substrate throughput.

The system controller 436 includes a central processing unit (CPU) 438, a memory 440, and a support circuit 442. The CPU 438 may be one of any form of a general purpose computer processor that can be used in an industrial setting. The support circuit 442 is conventionally coupled to the CPU 438, and may include cache, clock circuits, input/output subsystems, power supplies, and the like. The software routines, when executed by the CPU 438, transform the CPU into a specific purpose computer controller. The software routines may also be stored and/or executed by a second controller (not shown) that is located remotely from the integrated processing system 400.

One example of a possible configuration of the integrated processing system 400 for removing halogen-containing residue in accordance with the present disclosure includes two load-lock chambers (chambers 422), the PRECLEAN II™ chamber (chamber 410), the AXIOM® chamber (chamber 414), three SYM3® chambers (chambers 412, 416 and 420), and the metrology chamber (chamber 418).

Figure 5A:
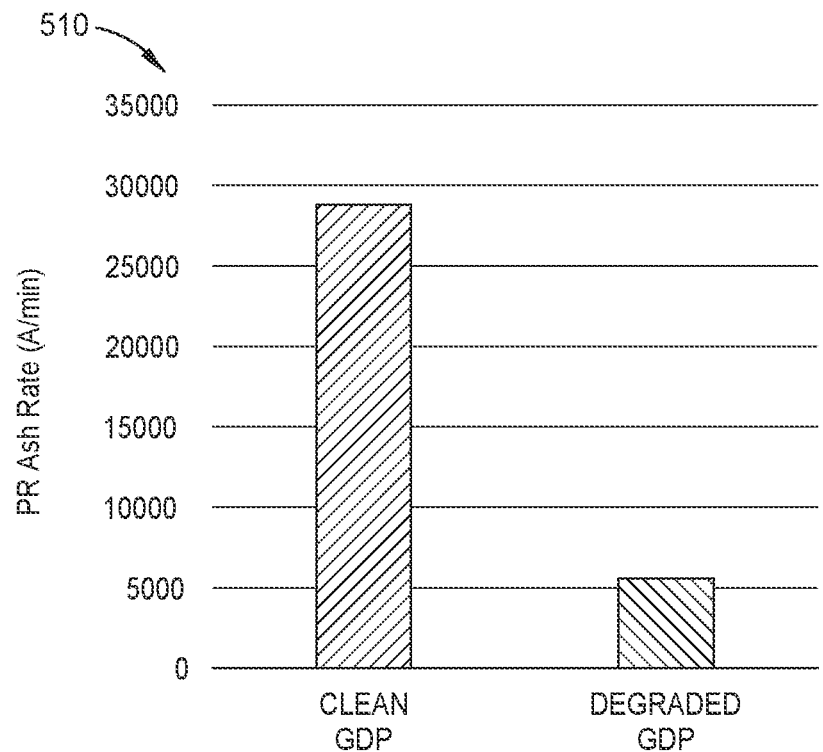
FIG. 5A is a plot depicting ash rate behavior for a clean gas distribution plate versus a contaminated gas distribution plate.

FIG. 5A is a plot 510 depicting ash rate behavior for a clean gas distribution plate versus a contaminated gas distribution plate. As depicted in plot 510 the ash rate for the contaminated gas distribution plate drops significantly due to titanium combination after 100 RF hours of production.

Figure 5B:
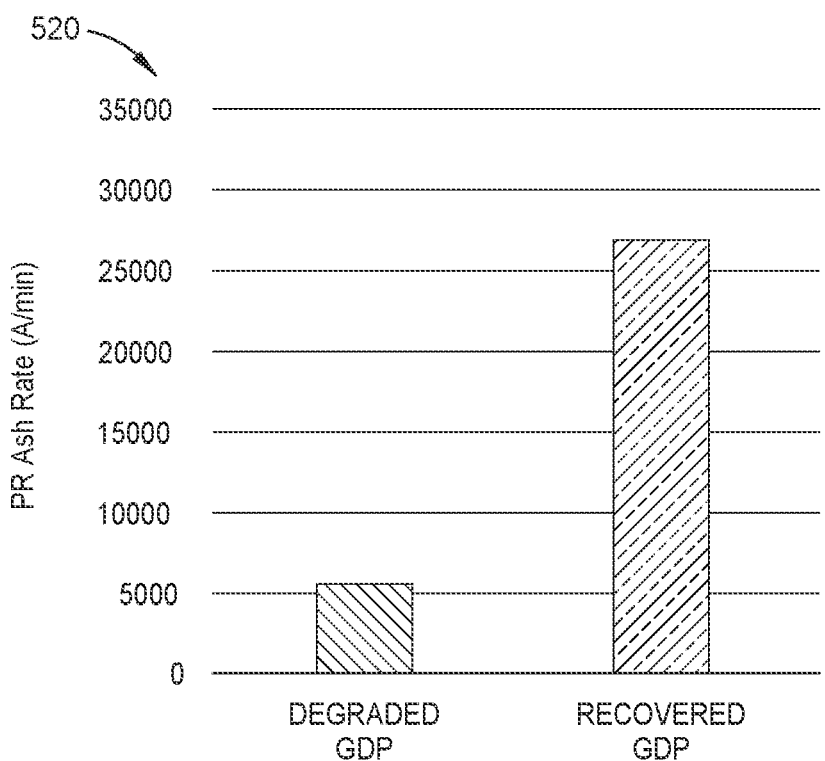
FIG. 5B is a plot depicting ash rate behavior for a contaminated gas distribution plate versus a gas distribution plate, which was processed according to the methods described herein.

FIG. 5B is a plot 520 depicting ash rate behavior for a contaminated gas distribution plate versus a gas distribution plate, which was processed according to the methods described herein. As depicted in plot 520, after exposing the contaminated gas distribution plate to 3 RF hours of the recovery method described herein, the recovered gas distribution plate recovered almost 90% of its original ash rate compared to the clean gas distribution plate shown in FIG. 5A.

Implementations of the present disclosure can include one or more of the following advantages. The ash recovery process of the present disclosure recovers ash rate by in-situ silicon oxide layer formation over a contaminated chamber surface using a carrier wafer containing a silicon chloride byproduct or residue formed thereon, which eliminates the need to open the chamber to swap out contaminated chamber parts. This reduces chamber downtime and lost production, which increases the service interval of the chamber.

Implementations and all of the functional operations described in this specification can be implemented in digital electronic circuitry, or in computer software, firmware, or hardware, including the structural means disclosed in this specification and structural equivalents thereof, or in combinations of them. Implementations described herein can be implemented as one or more non-transitory computer program products, i.e., one or more computer programs tangibly embodied in a machine readable storage device, for execution by, or to control the operation of, data processing apparatus, e.g., a programmable processor, a computer, or multiple processors or computers.

The processes and logic flows described in this specification can be performed by one or more programmable processors executing one or more computer programs to perform functions by operating on input data and generating output. The processes and logic flows can also be performed by, and apparatus can also be implemented as, special purpose logic circuitry, e.g., an FPGA (field programmable gate array) or an ASIC (application specific integrated circuit).

The term "data processing apparatus" encompasses all apparatus, devices, and machines for processing data, including by way of example a programmable processor, a computer, or multiple processors or computers. The apparatus can include, in addition to hardware, code that creates an execution environment for the computer program in question, e.g., code that constitutes processor firmware, a protocol stack, a database management system, an operating system, or a combination of one or more of them. Processors suitable for the execution of a computer program include, by way of example, both general and special purpose microprocessors, and any one or more processors of any kind of digital computer.

Computer readable media suitable for storing computer program instructions and data include all forms of nonvolatile memory, media and memory devices, including by way of example semiconductor memory devices, e.g., EPROM, EEPROM, and flash memory devices; magnetic disks, e.g., internal hard disks or removable disks; magneto optical disks; and CD ROM and DVD-ROM disks. The processor and the memory can be supplemented by, or incorporated in, special purpose logic circuitry.

When introducing elements of the present disclosure or exemplary aspects or implementation(s) thereof, the articles "a," "an," "the" and "said" are intended to mean that there are one or more of the elements.

The terms "comprising," "including" and "having" are intended to be inclusive and mean that there may be additional elements other than the listed elements.

While the foregoing is directed to implementations of the present disclosure, other and further implementations of the disclosure may be devised without departing from the basic scope thereof, and the scope thereof is determined by the claims that follow.

The invention claimed is:

1. A method for processing substrates, the method comprising:
   positioning a passivation substrate in a processing volume of a processing chamber, wherein the passivation substrate has a silicon chloride residue formed thereon;
   evaporating the silicon chloride residue from the passivation substrate;
   depositing the evaporated silicon chloride on one or more interior surfaces in the processing volume;
   exposing the deposited silicon chloride to an oxidizing environment to convert the deposited silicon chloride to a silicon oxide passivation layer; and
   ashing a layer from a production substrate in the processing volume of the processing chamber having the silicon oxide passivation layer on the one or more interior surfaces.

2. The method of claim 1, wherein evaporating the silicon chloride residue from the passivation substrate comprises heating the passivation substrate to a temperature of at least 200 degrees Celsius.

3. The method of claim 1, wherein the oxidizing environment comprises an oxygen-containing plasma, oxygen radicals, or a combination thereof.

4. The method of claim 3, further comprising forming the oxygen radicals by energizing a gas mixture comprising an oxygen-containing gas in a remote plasma chamber.

5. The method of claim 4, wherein the oxygen-containing gas comprises an oxidizing agent selected from oxygen, water vapor, ozone, nitrous oxide, or a combination thereof.

6. The method of claim 5, wherein the gas mixture further comprises an additive selected from nitrogen, argon, helium, or a combination thereof.

7. The method of claim 1, wherein evaporating the silicon chloride residue from the passivation substrate comprises heating the passivation substrate in a gas mixture of oxygen and nitrogen.

8. The method of claim 7, wherein exposing the deposited silicon chloride to the oxidizing environment further comprises maintaining the passivation substrate at a temperature of at least 200 degrees Celsius.

9. The method of claim 7, wherein a flow ratio of oxygen to nitrogen is about 10:1.

10. The method of claim 1, wherein at least a portion of the one or more chamber surfaces has a refractory metal deposited thereon and the silicon oxide passivation layer is formed over the refractory metal.

11. The method of claim 1, wherein at least one of the one or more chamber surfaces are formed from aluminum, stainless steel, or a combination thereof.

12. The method of claim 1, wherein the one or more chamber surfaces comprises a surface of a gas distribution plate.

13. A method for processing substrates, the method comprising:
    exposing a passivation substrate having an exposed silicon-containing surface to an etching gas mixture comprising a chlorine-containing gas to form a silicon chloride residue on the exposed silicon-containing surface;
    positioning the passivation substrate in a processing volume of a plasma processing chamber;
    heating the passivation substrate to evaporate the silicon chloride residue from the exposed silicon-containing surface and deposit the silicon chloride residue on one or more interior chamber surfaces within the processing volume;
    exposing the silicon chloride to an oxidizing environment to convert the silicon chloride residue to form a silicon oxide passivation layer over the one or more interior surfaces in the processing volume of the plasma processing chamber, and
    ashing a layer from a production substrate in the processing volume of the processing chamber having the silicon oxide passivation layer on the one or more interior chamber surfaces.

14. The method of claim 13, wherein evaporating the silicon chloride residue from the passivation substrate comprises heating the passivation substrate to a temperature of at least 200 degrees Celsius.

15. The method of claim 13, wherein the oxidizing environment comprises oxygen radicals and the oxygen radicals are formed by energizing a gas mixture comprising an oxygen-containing gas in a remote plasma chamber.

16. The method of claim 15, wherein the oxygen-containing gas comprises an oxidizing agent selected from oxygen, water vapor, ozone, nitrous oxide, or a combination thereof.

17. A method for processing substrates, the method comprising:
    positioning a passivation substrate having an exposed silicon-containing surface in a first processing volume of a plasma processing chamber;
    exposing the passivation substrate to an etching gas mixture comprising a chlorine-containing gas to form silicon chloride residue on the exposed silicon-containing surface;
    transferring the passivation substrate to a second processing volume of the processing chamber;
    heating the passivation substrate to evaporate the silicon chloride residue from the exposed silicon-containing surface onto a gas distribution plate positioned in the second processing volume;
    exposing the silicon chloride residue on the gas distribution plate to an oxidizing environment to convert the silicon chloride residue to form a silicon oxide passivation layer over the gas distribution plate; and
    ashing a layer from a production substrate in the second processing volume of the processing chamber having the silicon oxide passivation layer on the gas distribution plate.

18. The method of claim 17, wherein the oxidizing environment comprises an oxygen-containing plasma, oxygen radicals, or a combination thereof.

19. The method of claim 17, wherein at least a portion of the gas distribution plate has a refractory metal deposited thereon and the silicon oxide passivation layer is formed over the refractory metal.

20. The method of claim 17, wherein evaporating the silicon chloride residue from the passivation substrate comprises heating the passivation substrate in a gas mixture of oxygen and nitrogen.

* * * * *